(12) United States Patent
Nadeau et al.

(10) Patent No.: US 9,325,334 B2
(45) Date of Patent: Apr. 26, 2016

(54) IC, PROCESS, DEVICE GENERATING FREQUENCY REFERENCE FROM RF GAS ABSORPTION

(71) Applicant: TEXAS INSTRUMENTS INCORPORATED, Dallas, TX (US)

(72) Inventors: Phillip Michel Nadeau, Cambridge, MA (US); Django Trombley, Dallas, TX (US); Baher S. Haroun, Allen, TX (US); Srinath Mathur Ramaswamy, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 341 days.

(21) Appl. No.: 13/916,331

(22) Filed: Jun. 12, 2013

(65) Prior Publication Data

US 2014/0368377 A1 Dec. 18, 2014

(51) Int. Cl.
*H03L 7/26* (2006.01)

(52) U.S. Cl.
CPC ...................... *H03L 7/26* (2013.01)

(58) Field of Classification Search
CPC ... H01S 5/0687; H01S 3/1303; H01S 5/0654; H01S 3/1392; G01N 2201/0694; G01N 2201/1211; G01N 2201/1247; G01N 22/00; G01S 7/40; G01S 7/41; G01J 3/28; G01J 3/42; H03L 7/26
USPC ............ 342/22, 192; 324/600, 629, 637, 639, 324/642
See application file for complete search history.

(56) References Cited

U.S. PATENT DOCUMENTS

| | | | | |
|---|---|---|---|---|
| 2,774,876 A * | 12/1956 | Dicke | ................. | 331/3 |
| 2,867,781 A * | 1/1959 | Kiyo | ............................. | 333/202 |
| 2,882,493 A * | 4/1959 | Dicke | ........................... | 324/633 |
| 3,192,472 A * | 6/1965 | Bender et al. | ................. | 356/218 |
| 3,456,185 A * | 7/1969 | Hattori et al. | ................. | 324/636 |
| 3,562,631 A * | 2/1971 | Lee et al. | ...................... | 324/305 |
| 3,728,613 A * | 4/1973 | Hearn | ........................... | 324/301 |
| 3,784,307 A * | 1/1974 | Jackson et al. | .................. | 356/51 |
| 3,866,118 A * | 2/1975 | Ghosh et al. | ................. | 324/639 |
| 3,922,551 A * | 11/1975 | Williams | ...................... | 250/343 |
| 3,973,186 A * | 8/1976 | Uehara et al. | ................. | 324/636 |
| 4,405,905 A * | 9/1983 | Busca et al. | ................. | 331/94.1 |
| 4,494,085 A * | 1/1985 | Goldberg | ..................... | 331/94.1 |
| 4,495,478 A * | 1/1985 | Kwon et al. | ................. | 333/230 |
| 4,607,521 A * | 8/1986 | Saito et al. | .................... | 73/23.2 |
| 4,661,782 A * | 4/1987 | Weidemann | ...................... | 331/3 |
| 4,894,603 A * | 1/1990 | Berger et al. | ................. | 324/639 |
| 4,896,097 A * | 1/1990 | Berger et al. | ................. | 324/639 |
| 4,925,302 A * | 5/1990 | Cutler | ........................... | 356/128 |
| 4,972,699 A * | 11/1990 | Berger et al. | ................. | 73/23.2 |
| 5,184,241 A * | 2/1993 | Schwemmer | ................... | 398/93 |
| 5,507,173 A * | 4/1996 | Shearer et al. | ................. | 73/23.2 |
| 5,517,157 A * | 5/1996 | English | ........................ | 331/94.1 |
| 5,548,217 A * | 8/1996 | Gibson et al. | ................. | 324/316 |
| 5,637,872 A * | 6/1997 | Tulip | ........................... | 250/338.5 |
| 5,714,910 A * | 2/1998 | Skoczen et al. | ................... | 331/3 |
| 5,949,237 A * | 9/1999 | Berger et al. | ................. | 324/636 |
| 6,014,237 A * | 1/2000 | Abeles et al. | ................... | 398/87 |
| 6,133,800 A * | 10/2000 | Deng | .......................... | 331/94.1 |
| 6,249,343 B1 * | 6/2001 | Wang et al. | ................. | 356/243.1 |

(Continued)

*Primary Examiner* — Peter Bythrow
(74) *Attorney, Agent, or Firm* — Lawrence J. Bassuk; Frank D. Cimino

(57) ABSTRACT

A frequency reference device that includes a frequency reference generation unit to generate a frequency reference signal based on an absorption line of a gas.

17 Claims, 4 Drawing Sheets

(56) References Cited

U.S. PATENT DOCUMENTS

| | | | |
|---|---|---|---|
| 6,265,945 B1 * | 7/2001 | Delaney et al. | 331/3 |
| 6,421,120 B1 * | 7/2002 | Wildnauer | 356/243.1 |
| 6,525,312 B1 * | 2/2003 | Cousins | 250/281 |
| 6,806,784 B2 * | 10/2004 | Hollberg et al. | 331/94.1 |
| 6,888,780 B2 * | 5/2005 | Happer et al. | 368/10 |
| 6,900,702 B2 * | 5/2005 | Youngner et al. | 331/94.1 |
| 6,993,058 B2 * | 1/2006 | Zhu | 372/106 |
| 7,057,398 B2 * | 6/2006 | Zhu et al. | 324/639 |
| 7,202,751 B2 * | 4/2007 | Zhu et al. | 331/3 |
| 7,339,168 B2 * | 3/2008 | May | 250/338.5 |
| 7,342,229 B1 * | 3/2008 | Reiss | 250/339.13 |
| 8,117,010 B2 * | 2/2012 | Busch et al. | 702/190 |
| 8,296,106 B2 * | 10/2012 | Noll et al. | 702/189 |
| 8,304,719 B2 * | 11/2012 | Wang et al. | 250/288 |
| 8,482,739 B1 * | 7/2013 | Wanke et al. | 356/484 |
| 2003/0039015 A1 * | 2/2003 | Vujkovic-Cvijin et al. | 359/187 |
| 2005/0207456 A1 * | 9/2005 | Berberian et al. | 372/11 |
| 2005/0285023 A1 * | 12/2005 | Liu | 250/221 |
| 2006/0022761 A1 * | 2/2006 | Abeles et al. | 331/94.1 |
| 2006/0083277 A1 * | 4/2006 | Zhu et al. | 372/39 |
| 2009/0074016 A1 * | 3/2009 | Mamer et al. | 372/22 |
| 2010/0189605 A1 * | 7/2010 | Schmid et al. | 422/102 |
| 2010/0321117 A1 * | 12/2010 | Gan | 331/3 |
| 2011/0130973 A1 * | 6/2011 | Kimura | 702/24 |
| 2012/0235755 A1 * | 9/2012 | Chindo | 331/94.1 |
| 2013/0265573 A1 * | 10/2013 | Pate et al. | 356/311 |
| 2014/0028405 A1 * | 1/2014 | Hong | 331/94.1 |
| 2014/0347074 A1 * | 11/2014 | Nadeau | 324/639 |
| 2014/0368376 A1 * | 12/2014 | Nadeau et al. | 342/174 |
| 2014/0368377 A1 * | 12/2014 | Nadeau et al. | 342/192 |
| 2014/0373599 A1 * | 12/2014 | Trombley et al. | 73/24.02 |

* cited by examiner

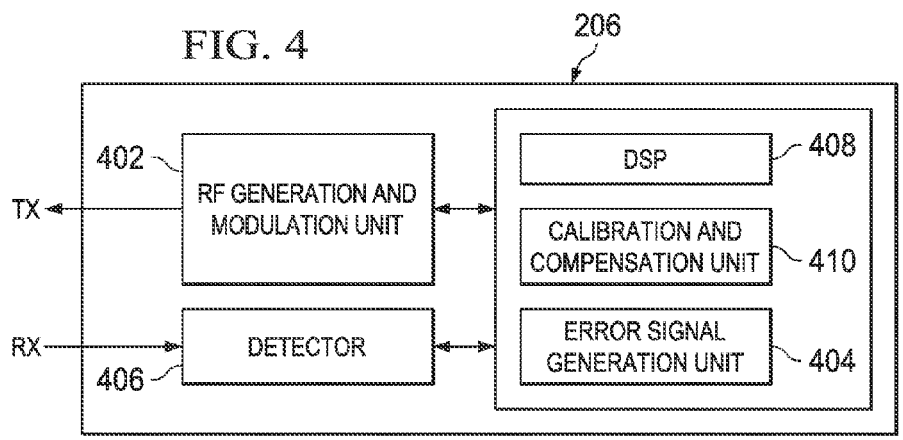
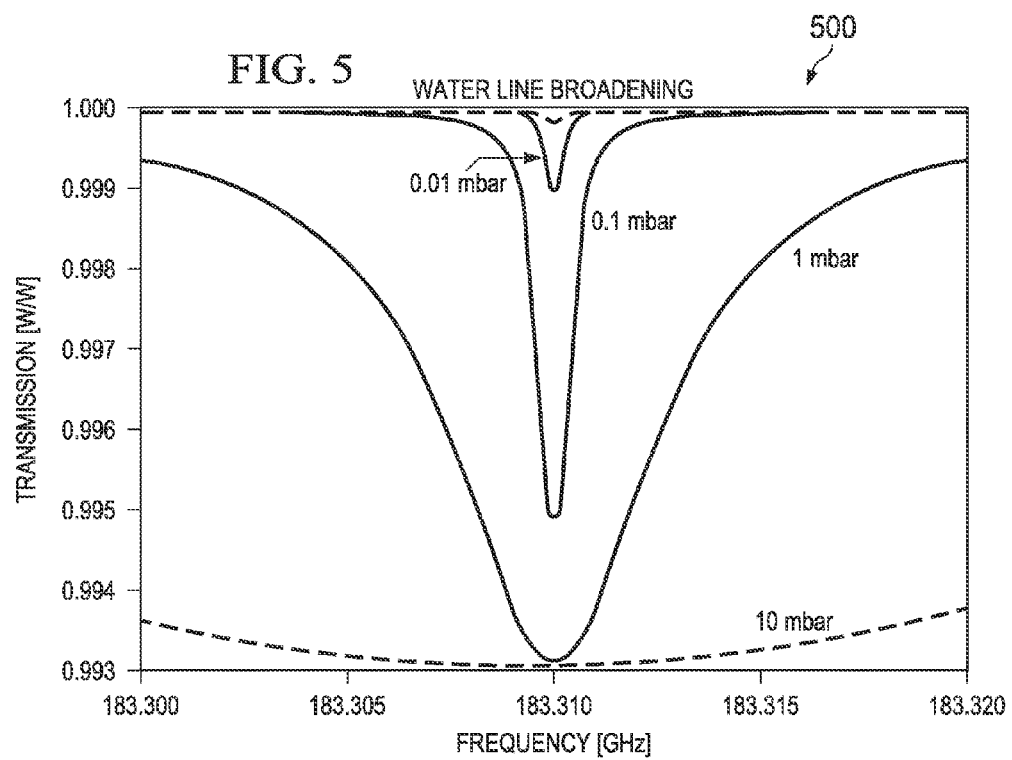

IC, PROCESS, DEVICE GENERATING FREQUENCY REFERENCE FROM RF GAS ABSORPTION

BACKGROUND

Spectroscopy and spectrometers may be used as various measurement and reference tools. Such tools may use an array of measurement techniques on just about any form of matter. The measurement techniques may depend on the material of interest, which may dictate what frequency/wavelength may be best suited for the measurements. Spectrometers, for example, may be suited to measure emission and absorption spectrums. Further, transmission spectrometers may specifically look for characteristic absorption lines of a material. The absorption lines may be used to identify an unknown substance from a catalogue of known spectrums, or the absorption line may be used to detect the amount of a known substance in a sample. In general, spectroscopy principles may be used for various measurements or to define a reference based on frequency or wavelength.

SUMMARY

Spectroscopic principles may be used in a frequency reference device that includes a frequency reference generation unit to generate a frequency reference signal based on an absorption line of a gas.

Spectroscopic principles may also be implemented in a method of generating a reference frequency that includes receiving a radio frequency (RF) signal transmitted through a gas absorption cell containing a gas, detecting an absorption line of the gas with the RF signal, and generating a reference frequency based on the frequency of the absorption line.

Spectroscopic principles may further be used in a system for generating a reference frequency signal that includes a gas absorption cell containing a gas and a signal generation and detection unit. The signal generation and detection unit to generate a RF signal, detect an absorption line of the gas, lock-in on the absorption line, and output a reference frequency signal based on the absorption line.

BRIEF DESCRIPTION OF THE DRAWINGS

For a detailed description of exemplary embodiments of the invention, reference will now be made to the accompanying drawings in which:

FIG. 4 shows a block diagram of the IC 206 in accordance with various examples discussed herein;

FIG. 5 shows a plot of transmission spectra of the 183.31 GHz absorption line of water at various pressures;

NOTATION AND NOMENCLATURE

Figure 1:
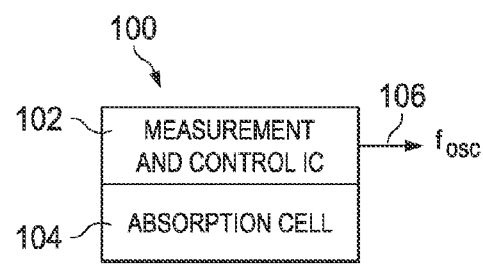
FIG. 1 shows a block diagram of a single package reference generation device 100 in accordance with various examples as described herein.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Spectroscopy may be utilized in various ways and at a wide range of frequencies. Spectral analysis may be used to determine optical characteristics of samples, a sample being a gas or a solid, for example. Spectral analysis may also be used to determine inherent characteristics of molecules, characteristic absorption mechanisms and their corresponding frequencies, for example. Most elements and readily occurring molecules have been analyzed over the years to provide a spectral database of these known substances. This database may be used to help determine the makeup of an unknown gas sample, for instance, by performing spectroscopy on the sample and then comparing any detected absorption peaks and their corresponding frequencies to the database. Additionally, the measured spectrum may also be used to determine the amount of a specific gas in the sample. In addition to using a spectrometer an analytical tool, spectroscopic principles may also be used to generate a frequency reference for use as a clock signal for electronics, for example.

Clock references used in all types of computing devices are conventionally fabricated from crystals, typically quartz, using the intrinsic oscillations of the crystal as a frequency reference. The crystal oscillators can be fabricated into small form factors useable in computer systems and mobile computing devices, but may have an upper limit on accuracy in the parts-per-million. This limit on accuracy means that computing and communication applications that are sensitive to changes in a reference frequency, or the system clock, may not operate properly at times. On the other end of the spectrum, atomic clocks are extremely accurate (in the range of $10^{14}$), but due to their components, may be the size of a small car. Thus, a small form factor, accurate clock for computing and communication devices may be desirable for many applications and systems.

A method and system for generating a chip-scale frequency reference based on the absorption line of a gas is described herein. The method and system uses the center frequency of the absorption line of the gas as the reference frequency, which is detected using radio frequency (RF) signals in the millimeter-wave (mmwave), microwave, and terrahertz (THz) frequency sections of the electro-magnetic (EM) spectrum. Upon detection of the absorption line, the absorption line may be locked-in on and tracked by the system. Tracking the absorption line may allow the system to generate a stable frequency reference.

FIG. 1 shows a block diagram of a single package reference generation device 100 in accordance with various examples as described herein. The device 100 may include a measurement and control integrated circuit (IC) 102 and an absorption cell 104 (absorption cell 104 may also be referred to as cell 104). The measurement and control IC 102 may be a single IC mounted to the cell 104. The measurement and control IC 102 may include RF signal generation, transmission and detection components, a signal analysis unit and a reference frequency signal generation unit. The measurement and control IC 102 may be mounted to the cell 104 so that the RF signals generated are transmitted into the cell 102 and, after the RF signals pass through the cell 104, received from the cell 104. Alternatively, the measurement and control IC 102 may be comprised of multiple IC chips interconnected and mounted to the cell 104.

The cell 104 may comprise an internal waveguide filled with a gas, water vapor for example, and may include access ports or access windows for the RF signals to pass through on their way into and out of the cell 104. The gas contained with the cell 104 may be kept at a low pressure, 0.1 mbar for example, to facilitate the detection of characteristic absorption lines of the gas. Other pressures may also be implemented and is not a limiting aspect of the device 100. The pressure of the gas in the cell 104 may assist with differentiating the absorption line from the background, which in turn may decrease the detection time of the device 100.

The measurement and control IC 102 may generate and modulate RF signals that are transmitted into the cell 104. The RF signals may be used to first detect an absorption line of the gas in the cell 104 by sweeping the RF signals through a range of frequencies to detect the absorption line. The detection of the absorption line may be facilitated by the modulation scheme employed. The range of frequencies used may coincide with the known frequencies the absorption line including variations in the width of the absorption line. The width of the absorption line may be influenced by various factors, such as the pressure and temperature of the gas in the cell 104.

Once the absorption line has been detected, the measurement and control IC 102 may generate an error signal that used to adjust the frequencies at which the RF signals are transmitted so that the absorption line is tracked, or locked-in on, by the device 100. The measurement and control IC 102 may then use the frequencies of the RF signals to calculate and output a frequency reference signal, $f_{OSC}$ 106. For example, if the gas in the cell 102 is water vapor and the detected absorption line corresponds to a 183.31 GHz absorption line of water, the frequency reference signal 106 may be 183.31 GHz.

At device 100 start-up, or periodically, depending on how dynamic the absorption line of the gas is, the device 100 may implement a calibration process. The calibration process may be used to remove any background spectrum and noise from the spectrum measurement of the absorption line of interest. The calibration process may estimate performance characteristics of the cell 104 and of the detector associated with the measurement and control IC 102. The estimated performance characteristics of the cell 104 and the detector may then be used to remove a background spectrum from the received RF signals. This removal, or compensation, calculation may be continuously performed while the device 100 is generating the frequency reference signal 106.

Figure 2:
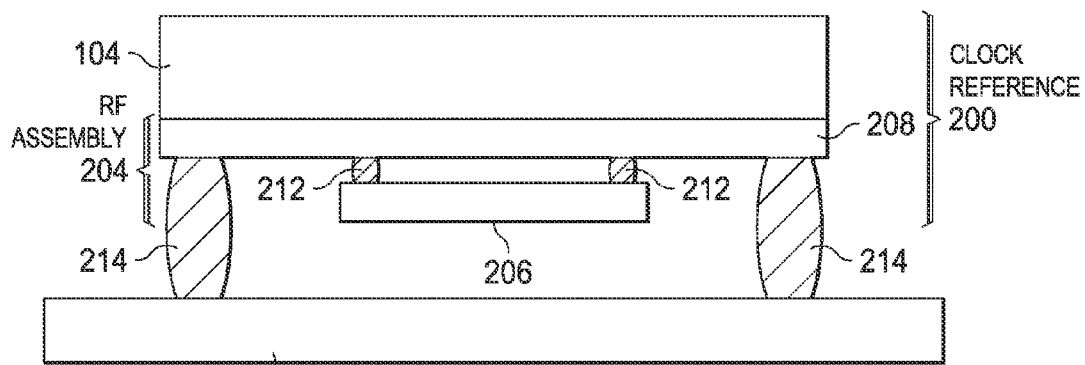
FIG. 2 shows a block diagram of a clock reference system in accordance with various examples discussed herein.

FIG. 2 shows a block diagram of a clock reference system 200 in accordance with various examples discussed herein. The clock reference system 200 may be another implementation of the single package reference generation device 100 of FIG. 1. The clock reference 200 may be mounted to a printed circuit board (PCB) 202 using solder balls 214, but any other known mounting method may be used. The clock reference 202 may include an IC 206, an antenna package 208, and the absorption cell 104. The antenna package 208 and the IC 206 may be interconnected to each other using solder balls 212, but any other forms of interconnection may be used. The interconnection between the IC 206 and the antenna package 208 may be used to convey electrical signals between one another. As such, the interconnection of the IC 206 and ant antenna package 208 may be both four mounting and electrical connection purposes. Alternatively, IC 206 and antenna package 208 may be combined into a single IC.

The cell 104 and the antenna package 208 may be coupled to one another so that the RF signals are transmitted into the cell 104 from the antenna package 208 at one location and received by the antenna package 208 after passing through the cell 104 at another location. The antenna package 208 may include an RF transmission antenna aligned to one access port of the cell 104. The antenna package 208 may also include an RF receiver antenna aligned with another access port of the cell 104.

The IC 206 may perform many of the same functions as the measurement and control IC 102 and may include RF generation, modulation and detection components along with various other signal processing and control units. The IC 206 may perform the same steps as discussed above with respect to the device 100 in generating a clock signal. The IC 206 may generate and modulate RF signals that are transmitted through the cell 104 to detect an absorption line of a gas, water vapor, for example. Once the absorption line has been detected, the IC 206 may generate a feedback or control signal to adjust the frequencies at which the RF signals are transmitted so to lock-in on the absorption line. By locking-in on the absorption line, the IC 206, and the clock reference 200, may generate a steady and accurate frequency reference signal to be used by any electronics associated with the clock reference 200.

Additionally, at system start up, the IC 206 may perform a calibration of the clock reference 200 similar to the calibration steps performed by the device 100. The calibration values obtained by the IC 206 may then be used to continuously compensate the RF signals detected by the IC 206 to enhance the accuracy of the frequency reference signal.

Figure 3:
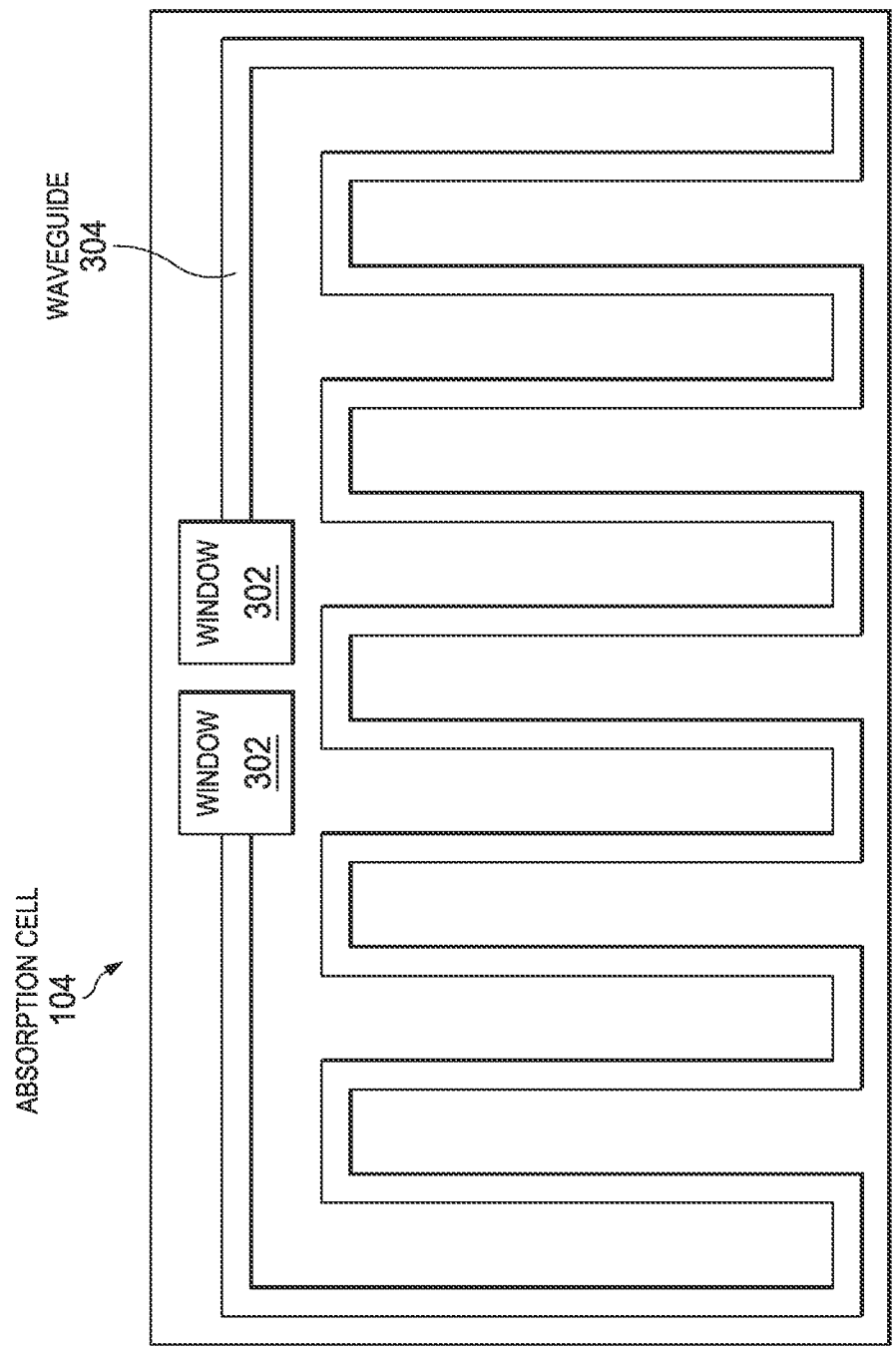
FIG. 3 shows an example of an absorption cell in accordance with various examples as discussed herein.

FIG. 3 shows an of an absorption cell 104 in accordance with various examples discussed herein. The absorption cell 104 may include two access windows 302, or simply windows 302, and a waveguide 304. The windows 302 may be transparent to the RF signals being transmitted into and coming out of the cell 104. The access windows may be comprised of a dielectric material, or any other material, that is transparent to the RF signals and may be mounted onto the cell 104 so that a seal is formed with the cell 104 body. The body of the cell 104 may be composed of metal, e.g., brass, or a high dielectric constant material, e.g., ceramic.

The waveguide 304 may contain the gas and may be the path the RF signals take from one window 302 to the other window 302. The length of the waveguide 304 may affect the time required by the clock reference 200 or device 100 to detect the absorption line of the gas. The length of the waveguide 304 may also affect the signal to noise ratio when detecting the absorption line. The detection time and signal-to-noise ratio may be interrelated, and one may be the inverse of the other. The signal-to-noise ratio and the waveguide length may also be related by two competing factors. One such factor may be that a longer waveguide 304 has a stronger gas absorption line signal, thus potentially increasing the signal-to-noise ratio and decreasing the detection time. The second factor may be that a longer waveguide will also transmit less total RF power, contributing to a reduction in the signal-to-noise ratio and a longer detection time. Vice-versa for a shorter waveguide 304. Hence there is an optimum waveguide length that maximizes the signal-to-noise ratio contributions of these two factors, and it will depend on the RF power constraint of the system. A conventional gas spectrometer may use a gas absorption cell with a length of about one meter, but for a small footprint, PCB mounted device, this may not be practical. The optimal waveguide length that maximizes the signal to noise ratio may also be longer than is practical in a small footprint system. Hence, the desired detection time and the permissible signal-to-noise ratio may help determine a practical waveguide 304 length.

The waveguide 304 is shown in a serpentine pattern to increase the path length the RF signals take from one window 302 to the other window 302. The serpentine pattern may allow for more interaction between the RF signals and the gas so to create a strong absorption line signal to aid in the detection and tracking of the absorption line. Alternatively, the waveguide 304 may be a spiral shape using two intertwined spirals that meet in the center. This spiral orientation may have an access window where the two spirals begin on the outside. The disclosure is not limited to these two orientations and many other variations may be used within the disclosure's scope.

FIG. 4 shows a block diagram of the IC 206 in accordance with various examples discussed herein. The IC 206 may comprise an RF generation and modulation unit 402, an error signal generation unit 404, a detector 406 (detector 406 may also be referred to as a receiver 406), a digital signal processor (DSP) 408, and a calibration and compensation unit 410. The various units 402-410 may function in concert with one another so that the IC 206 detects and tracks the absorption line of the gas in the cell 102 to generate a frequency reference signal. Further, the various units 402-410 may represent just some of the functionality of the IC 206 and may be augmented by further analytical units.

The RF generation and modulation unit 402 may be used to generate the RF signals transmitted into the cell 104. The RF signals may be modulated using a variety of modulation techniques, such as amplitude modulation (AM), frequency modulation (AM), or frequency-shift keying (FSK). The RF signals may be generated in a range of frequencies that cover the mmwave, the microwave, and the THz frequencies of the EM spectrum. The transmission of the RF signals may be used to detect the absorption line of the gas and to lock-in on the absorption line once detected. The center frequency of the absorption line, once acquired and tracked, may then be used as a frequency reference by the device 100 or the clock reference 200. The RF generation and modulation unit 402 may be coupled to the other units 404-410 of the IC 206 and may also be coupled to the RF transmitter antenna included in the antenna package 208.

The RF generation and modulation unit 402 may sweep RF signals through a range of frequencies to first detect the absorption line, the 183.31 GHz absorption line of water for example. If the unit 402 is using FSK modulation, which uses two RF tones separated by a set span of frequencies, for example, the two tones may be alternately transmitted and measured by the detector 406. The two tones may be transmitted at a 50% duty cycle. The frequency span separating the two tones may coincide with the half-width at half-maximum of the absorption line. The unit 402 may send the two tones to the RF transmitter antenna in antenna package 208 to be transmitted into the cell 104. The unit 402 may use lock-in or matched filtering detection techniques to improve the signal-to-noise ratio The detector 406 may be coupled to the RF receiver antenna located on the antenna package 208 to receive the transmitted RF signals after passing through the cell 102. The detector 406 may also be coupled to the various other units (402, 404, 408, and 410) comprising the IC 206. The detector 406 may be used to detect the magnitude of the transmitted/received RF signals, the two FSK tones to continue the example. The magnitude of the received tones may represent the amount of absorption (transmission) the RF tone experienced at that frequency. As such, the magnitude of the two tones may change when swept through the range of frequencies. However, when the two tones straddle the absorption line, there may be two frequencies where the two tones' magnitudes become equal. At that instance, the absorption line may be detected. Then, to keep the two tones straddling the absorption line, feedback may be required to control the frequencies at which the two tones are being transmitted.

The error signal generation unit 404 may be coupled to the various other units 402, 406-410 and may be used to generate feedback, an error signal, for driving the RF generation and modulation unit 402. By driving the unit 402, the error signal allows the absorption line to be locked-in on by the unit 402. To continue the FSK modulation example, the error generation unit 404 may use the magnitude differences between the two FSK tones to generate the error signal. The magnitude difference between the two signals will determine how much to adjust the frequencies of the two tones and in what direction to make those adjustments. The aim of the error signal generation unit 404 may drive the magnitude difference to zero, which would correspond to the two tones straddling the center frequency of the absorption line. A zero may represent that the two FSK tones lie equidistant from the center frequency of the absorption line. The error generation unit 404 may receive the detected tones directly from the detector 406 or the tones used by the error generation unit 404 may come from the calibration and compensation unit 410 and/or the DSP 408. The data used by the error generation unit 404 may be the raw signals received by the detector 406 or they may be signals that have already been processed to remove the background spectrum.

The calibration and compensation unit 410 may be coupled to the various other units 402-408 of the IC 206 and may calibrate the device 100 (clock reference 200) so that the background spectrum may be removed from the detected RF signals. Removal of the background signal may aid in more robust detection and tracking of the absorption line of the gas. The calibration process, as described above, may involve the unit 410 estimating the performance characteristics of the cell 104 and the detector 406. The values representing the performance characteristics of the cell 104 and the detector 406 may then be used to compensate the received FSK tones, thus removing the background spectrum from the measured spectrum. The unit 410 may perform the compensation of the two tones or the DSP 408 may perform the compensation calculations. Additionally, the compensated tones may be used by the error generation unit 404 to calculate the error signal. Using the compensated values for the received tones may generate a more accurate error signal resulting in better tracking of the absorption line and ultimately a more accurate and stable frequency reference signal.

The DSP 408 may be coupled to the various other units of the IC 206 and may be used for various signal processing tasks. One example was just described, but the DSP 408 may also be used in conjunction with the error signal generator 404 in calculating the error signal that varies the frequencies at which the RF signals are generated.

As should be recognized, the various units 402-410 may be combined into fewer units or modules. For example, the DSP 408 may perform all or some of the function as the error signal generator 404. Additionally or alternatively, some of the units may be software executed by a processor, firmware, or a combination of software and hardware.

FIG. 5 shows a plot 500 of transmission spectra of the 183.31 GHz absorption line of water at various pressures. The plot 500 illustrates how the width of the absorption line and the magnitude of absorption changes with pressure. With regards to the magnitude of absorption, increasing the pressure of the gas within an absorption cell, such as cell 104, increases the amount of absorption until saturation is reached. However, increases in pressure also increase the width of the absorption line. The broadening of the absorption line is due to a mix of pressure broadening (an increase in pressure causes the molecules to collide, which affects the absorption width) and Doppler broadening (the molecules will be moving at different velocities, which also affects the absorption width). The pressure broadening may be dominant at high pressures while the Doppler broadening, dominant at low pressures, may create a minimum of the width of the absorption line.

Thus, the transition point between the two line broadening mechanisms may be a pressure to use for the gas within the cell 104. At this pressure point, 0.1 mbar on the transmission spectra 500, the magnitude of the absorption may be close to a maximum while the line width is still narrow, around 1 MHz. Keeping the line width narrow compared to other characteristics of the water transmission spectra (not shown) may allow the 183.31 GHz absorption line to be differentiated from other broad absorption peaks. Setting the pressure in the cell 104 to 0.1 mbar may then provide an absorption line with a magnitude that allows for a quick detection time and enhanced tracking due to the sharp slope of the absorption curve. For example, if using FSK detection, the two frequency tones discussed in 0033 may be placed at the two points of maximum slope on either side of the absorption line to provide the best discrimination of the frequency offset between the center of the two tones and the center frequency of the absorption line.

Figure 6:
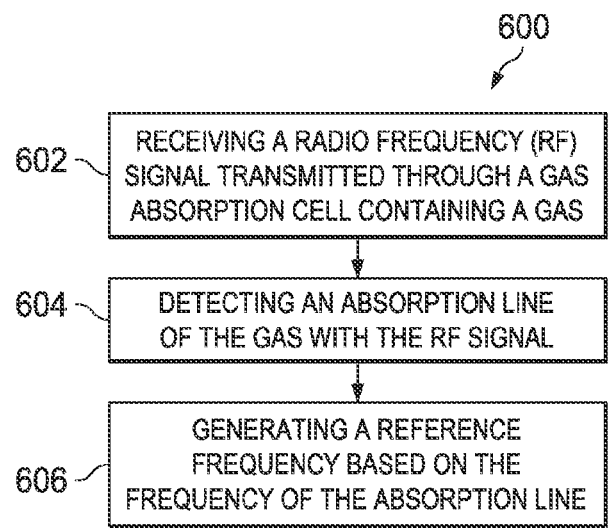
FIG. 6 is a flow chart of a method for generating a frequency reference in accordance with various examples discussed herein.

FIG. 6 is a flow chart of a method 600 for generating a frequency reference in accordance with various examples discussed herein. The method 600 begins at step 602 with receiving a RF signal transmitted through a gas absorption cell containing a gas. The RF signal may be generated and transmitted by the measurement and control IC 102 of device 100 through the cell 104, for example. The step 602 may also be implemented by the IC 206 of the clock reference 200. The transmitted RF signal may be a FSK tone generated and transmitted by the RF generation and modulation unit 402 of the IC 206, for example. The transmitted RF signal may then be received by the detector 406 of the IC 206 after passing through the gas, e.g., water vapor, contained in the cell 104.

The method 600 then continues at step 604 with detecting an absorption line of the gas with the RF signal. Again, the step 604 may be implemented by the measurement and control IC 102 of the device 100 or by the IC 206 of the clock reference 200. When implementing step 604 with the IC 206, the detector 406 may analyze the received RF signal for the absorption line, such as the 183.31 GHz absorption line of water. The received RF signal may be analyzed for a characteristic absorption around the 183.31 GHz frequency.

The method 600 then finishes at step 606 with generating a reference frequency based on the frequency of the absorption line. Once the absorption line of the gas has been detected by either the device 100 or the clock reference 200, the center frequency of the absorption line may be used as a frequency reference. When water vapor is used as the gas in the cell 104, the 183.31 GHz absorption line may be the absorption line detected and that frequency, 183.31 GHz, may then be the frequency reference output by the device 100.

Figure 7:
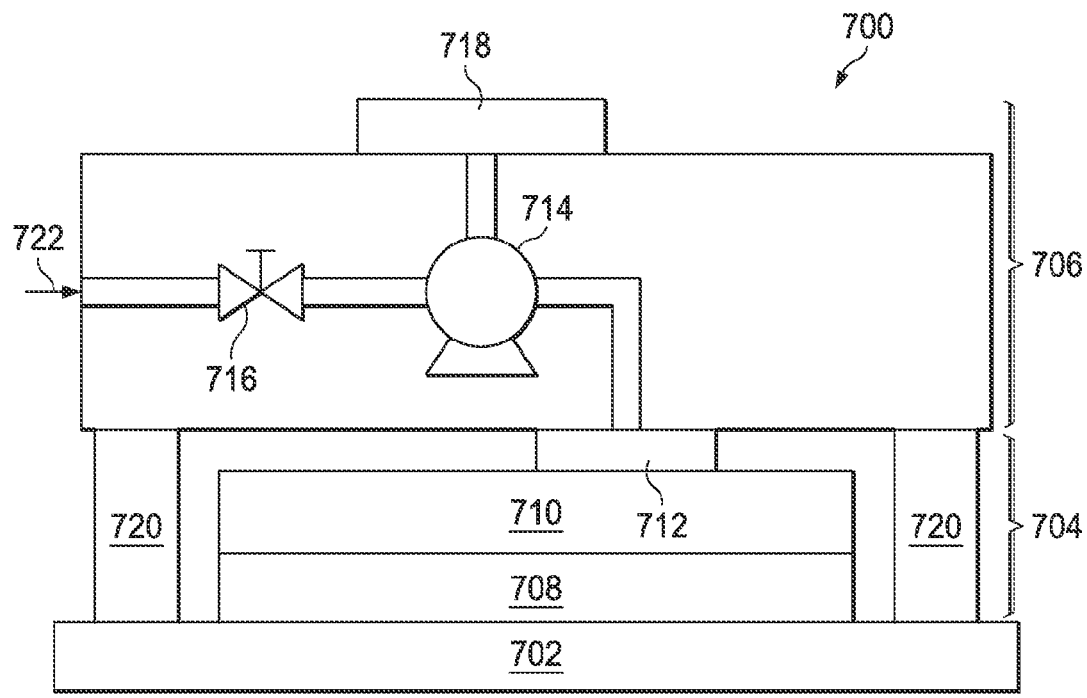
FIG. 7 shows a spectrometer in accordance with various examples discussed herein.

FIG. 7 shows a spectrometer 700 in accordance with various examples discussed herein. The spectrometer 700 may be used to analyze gas samples to determine what gases may be present in a sample and/or the concentration of gases in the sample. The spectrometer 700 may be mounted to a PCB 702 using securing members 720. The spectrometer 700 may comprise two main sections—a sensor 704 and a sampling system 706. The sensor 704 may implement many, if not all, the functionality discussed above with respect to the device 100 and the clock reference 200. Instead of implanting the above described functionality to generate a frequency reference signal, the spectrometer 700 may implement those functions to determine the composition of an unknown gas sample or the concentration values of a known gas sample. The gases may be analyzed by detecting absorption peaks and comparing the center frequencies of those peaks to a dataset of known absorption peaks. The concentration of a known gas sample may be determined based on the magnitude of a measured absorption line along with the width of that absorption line.

The sensor 704 may include an RF assembly 708 and an absorption cell 710. The absorption cell 710 may be similar to the cell 104 and may include two access windows for RF transmission and may include a waveguide in any of the above discussed designs. The sensor 204 may also include a gas port 712 that may be used to deliver a gas sample into the absorption cell 710 and to remove the gas sample from the absorption cell 710 after completing the analysis. The gas port 712 may make a hermetic seal with the absorption cell 710 so that no spurious gases enter the absorption cell 710 when a gas sample is either being loaded or removed.

The RF assembly 708 may be similar to the measurement and control unit 102 or the combination of the IC 206 and the antenna package 208 and the RF assembly 708 may implement the RF generation and detection of an absorption line of the gas sample in the absorption cell 710.

The sampling system 706 may be used to deliver a gas sample to the absorption cell 710. The sampling system 706 may include a pump system 714, a valve system 716, and a sample port 718. The sample port 718 may be used to introduce the gas sample to be analyzed to the spectrometer 700. The pump system 714 may be used to evacuate the absorption cell 710 before filling the absorption cell 710 with a gas sample from the sample port 718. The pump system 714 may also be used to maintain a set pressure in the absorption cell 710. The valve system 716 may be opened to allow a carrier gas 722 to assist moving the gas sample from the sample port 718 to the absorption cell 710. The carrier gas 722 may be an inert gas so that interactions with the gas sample do not occur. Additionally, the transmission spectrum of the carrier gas 722 may known by the spectrometer 700 so that the carrier gas 722's spectrum may be removed from the spectrum of the gas sample before analysis occurs.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated circuit comprising:
    (A) a radio frequency generation unit having a transmit output for carrying radio frequency tones and a control input;
    (B) a radio frequency detector unit having a receive input for receiving the radio frequency tones modulated by a certain gas, and a detector output indicating the received radio frequency tones modulated by a certain gas; and
    (C) processor circuitry having an input coupled to the detector output, a control output coupled to the control input of the generation unit, and a frequency reference signal output.

2. The integrated circuit of claim 1 in which the processor circuitry includes a digital signal processor.

3. The integrated circuit of claim 1 in which the processor circuitry includes a calibration and compensation unit.

4. The integrated circuit of claim 1 in which the processor circuitry includes an error signal generation unit.

5. The integrated circuit of claim 1 in which the radio frequency generation unit can produce frequency shift key radio frequency tones.

6. A process of generating a frequency reference signal from an integrated circuit comprising:
    (A) producing from transmitter circuitry on an integrated circuit radio frequency tone signals;
    (B) controlling by processor circuitry on the integrated circuit the producing radio frequency tone signals;
    (C) receiving in a detector on the integrated circuit modulated radio frequency tone signals in response to the produced radio frequency tone signals being modulated by a certain gas;
    (D) processing in processor circuitry on the integrated circuit the received modulated radio frequency tone signals to generate a frequency reference signal.

7. The process of claim 6 in which the producing includes producing frequency shift key radio frequency tone signals.

8. The process of claim 6 the controlling includes digital signal processor circuitry controlling transmitter circuitry to produce frequency shift key radio frequency tone signals.

9. The process of claim 6 in which the processing includes detecting an absorption line of the certain gas within the received modulated radio frequency tone signals.

10. The process of claim 6 in which the processing includes detecting an absorption line of the certain gas within the received modulated radio frequency tone signals and generating a frequency reference signal based on the frequency of the absorption line.

11. A reference generation device comprising:
    (A) an absorption cell having a body, a wave guide formed on the body that can contain a certain gas, and a window coupled to the wave guide that is transparent to radio frequency tones;
    (B) an antennae package having a transmit antennae coupled to the wave guide and a receive antennae coupled to the wave guide; and
    (C) a measurement and control integrated circuit, including
        (i) a radio frequency generation unit having a transmit output coupled to the transmit antennae, and a control input;
        (ii) a radio frequency detector unit having a receive input coupled to the receive antennae, and a detector output; and
        (iii) processor circuitry having an input coupled to the detector output, a control output coupled to the control input of the generation unit, and a frequency reference signal output.

12. The device of claim 11 in which the processor circuitry includes a digital signal processor.

13. The device of claim 11 in which the processor circuitry includes a calibration and compensation unit.

14. The device of claim 11 in which the processor circuitry includes an error signal generation unit.

15. The device of claim 11 in which the radio frequency generation unit can produce frequency shift key radio frequency tones.

16. The device of claim 11 in which the wave guide has two ends, the absorption cell has a window at each end, and the transmit antennae is coupled to one window and the receive antennae is coupled to the other window.

17. The device of claim 11 in which the absorption cell, the antennae package, and the measurement and control integrated circuit are mechanically joined together.

* * * * *